(12) United States Patent
Yunome

(10) Patent No.: US 6,310,928 B1
(45) Date of Patent: Oct. 30, 2001

(54) PLL CIRCUIT

(75) Inventor: Takao Yunome, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/665,683

(22) Filed: Sep. 20, 2000

(30) Foreign Application Priority Data

Sep. 24, 1999 (JP) .................................. 11-270537

(51) Int. Cl.[7] ...................................................... H03D 3/24
(52) U.S. Cl. ............................. 375/376; 331/57; 327/158
(58) Field of Search .................................... 375/376, 375, 375/374, 373; 327/158, 161, 244; 713/401; 331/57

(56) References Cited

U.S. PATENT DOCUMENTS 5,075,640   12/1991   Miyazawa .
5,490,182   2/1996    Arai .
5,847,617 * 12/1998   Reddy et al. ........................... 331/57
5,861,780 * 1/1999    Fukuda ................................... 331/57
6,114,915 * 9/2000    Huang et al. .......................... 331/25

* cited by examiner

Primary Examiner—Chi Pham
Assistant Examiner—Phuong Phu
(74) Attorney, Agent, or Firm—Finnegan, Henderson, Farabow, Garrett & Dunner, L.L.P.

(57) ABSTRACT

A PLL circuit comprises a storage/control circuit for storing, in an associated manner, a plurality of PLL output frequencies to be designated, lock ranges including the PLL output frequencies in their central regions respectively, and information on the number of stages of delay circuits. The number of stages of the delay circuits having a lock range including a designated PLL output frequency in its central region is selected and controlled by the storage/control circuit. A frequency divider selects and controls a frequency division ratio for obtaining a PLL output frequency on the basis of a frequency of a reference signal.

15 Claims, 4 Drawing Sheets

PLL CIRCUIT

CROSS-REFERENCE TO RELATED APPLICATIONS

This application is based upon and claims the benefit of priority from the prior Japanese Patent Application No. 11-270537, filed Sep. 24, 1999, the entire contents of which are incorporated herein by reference.

BACKGROUND OF THE INVENTION

The present invention relates to a PLL (Phase Locked Loop) circuit, in particular, a PLL circuit using, as a VCO (Voltage Controlled Oscillator), a ring oscillator which can select the number of stages in delay circuits connected in multistage fashion. The PLL circuit is used for various LSI (Large Scale Integration) circuits.

FIG. 5 is a block diagram showing a basic structure of a PLL circuit.

In this PLL circuit, reference numeral 51 denotes a phase comparator, 52 denotes a charge pump circuit, 53 denotes an LPF (Low Pass Filter), 54 denotes a VCO, and 55 denotes a frequency divider.

FIG. 6 is a block diagram showing an example of the frequency divider 55 in FIG. 5.

The frequency divider comprises a plurality of stages of flip-flop(F/F) circuits 61.

FIG. 7 is a block diagram showing an example of the VCO 54 in FIG. 5.

The VCO comprises a frequency-variable type ring oscillator in which an odd number of stages of voltage-variable type inverter delay circuits IV (7 stages in this example) are connected in a loop.

In the conventional PLL circuit using the ring oscillator having the above structure as the VCO 54, a frequency of an output from the ring oscillator 54 is divided by a number M by the frequency divider 55, the frequency-division output and a reference signal are compared by the phase comparator 51, a control voltage in association with the comparison output is generated by the charge pump circuit 52 and the LPF 53 and supplied to the VCO 54 as a delay time control input of the inverter delay circuits IV of the VCO 54.

Thereby, loop control is performed so that a phase of the frequency-division output is controlled to be the same as that of the reference signal IN. In the state where loop control is stabilized (a phase-lock state), the VCO 54 enters the state of oscillation at a frequency obtained by dividing the frequency of the reference signal IN by the number M. Further, an output signal (a PLL output) of the VCO 54 is supplied to various circuits as a system clock signal, for example.

When the PLL circuit enters the phase-locked state as described above, a stable state continues unless a phase difference is generated between the frequency-division output and the reference signal IN. A frequency range in which the PLL circuit can retain the phase-locked state is called a lock range. This lock range differs according to the number of stages of the inverter delay circuits IV.

FIG. 8 shows an example of the relationship between the cases where the number of the stages of the inverter delay circuits IV in the ring oscillator shown in FIG. 7 is 5, 7 and 9, and lock ranges A, B and C of the PLL output frequency (a system clock frequency) is changed.

Specifically, in accordance with the number of the stages of the inverter delay circuits IV, the delay time of the whole delay circuits greatly varies in a step-like fashion. The delay time of the whole delay circuits varies almost continuously in a certain range by varying the delay time of each inverter delay circuit IV (the varying amount is small) in the state of fixing the number of stages of the inverter delay circuits IV.

Therefore, according to the PLL circuit having the above structure, the oscillating frequency of the VCO 54 is substantially determined in accordance with the number of the stages of the inverter delay circuits IV, and enters the phase-locked state by control of the amount of delay time of the inverter delay circuits IV.

In the meantime, in the PLL circuit using the conventional ring oscillator as the VCO, as shown in FIG. 8, one ends of the adjacent lock ranges overlap each other if the number of the stages of the inverter delay circuits IV is changed. For example, one end of the lock range B of the ring oscillator having 7 stages of delay circuits IV overlaps with one end of the lock range A of the ring oscillator having 5 stages, and one end of the lock range B of the ring oscillator having 7 stages of the delay circuits IV overlaps with one end of the lock range C of the ring oscillator having 9 stages.

In the conventional art, when the number of stages of the inverter delay circuits IV is once determined in accordance with the PLL output frequency based on designed product specifications, the lock range (frequency band width) depending on the number of the stages is fixedly determined.

Further, there are cases where the PLL circuit enters the locked state in the vicinity of the boundary of the fixedly determined lock ranges. In the vicinity of the boundary of the lock ranges (for example, a frequency at the vicinity of the boundary of the lock ranges B and C is indicated by F1), the PLL output frequency goes out of the lock range in its number of the stages due to the manufacturing dispersion of elements and environmental conditions, etc. Therefore, there are cases where stability of the PLL operation is not ensured and the system clock signal cannot be stably supplied.

Furthermore, though the lock range determined by the number of stages of the delay circuits IV of the ring oscillator may be extended, in this method the extensible range is limited, and stability of the PLL operation is not still ensured in the vicinity of the boundary of the extended lock ranges, where jitter (fluctuation of edge of the output signal) of the PLL output frequency occurs and the PLL property deteriorates.

Moreover, in the conventional PLL circuit, whenever the PLL output frequency is greatly changed in accordance with the product specifications, it is necessary to redesign the mask pattern for changing the number of the stages of the delay circuits IV of the ring oscillator so as to obtain a desired lock range, which causes increase of manufacturing cost due to extension of a period of design and causes an obstacle to prompt commercialization of the PLL circuit.

As described above, the ring oscillator used as the VCO in the conventional PLL circuit has a problem that the stability of the PLL operation is not ensured and a system clock signal cannot be stably supplied in the case of the PLL circuit enters a locked state in the vicinity of the boundary of the lock ranges which are fixedly determined.

Further, whenever the PLL output frequency is greatly changed in accordance with the product specifications, it is necessary to redesign the mask pattern to change the number of the stages of the delay circuits IV of the ring oscillator so as to obtain a desired lock range, which causes increase of manufacturing cost due to extension of a period of design and causes an obstacle to prompt commercialization of the PLL circuit.

The present invention has been made in order to solve the above problems. The object of the present invention is to provide a PLL circuit in which stability of the PLL operation can be ensured by selecting a lock range in which a designated PLL output frequency is included in a central region thereof, by switching the number of stages of the delay circuits of the ring oscillator. The switching of the number of stages of the delay circuits can be easily switched so that a desired lock range can be obtained even when the PLL output frequency is greatly changed, thereby un-necessitating redesign in the number of stages of the delay circuits, inhibiting increase of manufacturing cost, and enabling prompt commercialization of the circuit.

BRIEF SUMMARY OF THE INVENTION

The PLL circuit of the present invention comprises a ring oscillator used as a VCO, a frequency divider for dividing a frequency of an output signal of the ring oscillator, a phase comparator for comparing a frequency-division output from the frequency divider and a reference signal, a control voltage generating circuit for generating a control voltage to be inputted to the ring oscillator in accordance with a comparison output from the phase comparator, and a control circuit for generating a control signal for controlling the number of stages of delay circuits of the ring oscillator on the basis of a designated PLL output frequency.

As described above, according to the PLL circuit of the present invention, stability of the PLL operation can be ensured by setting a designated PLL frequency in the central region of a lock range, the number of stages of the delay circuits of the ring oscillator can be easily switched even when the PLL output frequency is greatly changed, thereby a desired lock range can be obtained, and it is possible to maintain the PLL output frequency in the set central region of the lock range.

Therefore, it is possible to stably supply a PLL output signal whose jitter component is minimized, through a broad frequency range without being influenced by environmental change, thereby redesigning to change in the number of stages of the delay circuits can be omitted, increase of manufacturing cost can be inhibited, and prompt commercialization of the circuit is possible.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the drawings.

First Embodiment

Figure 1:
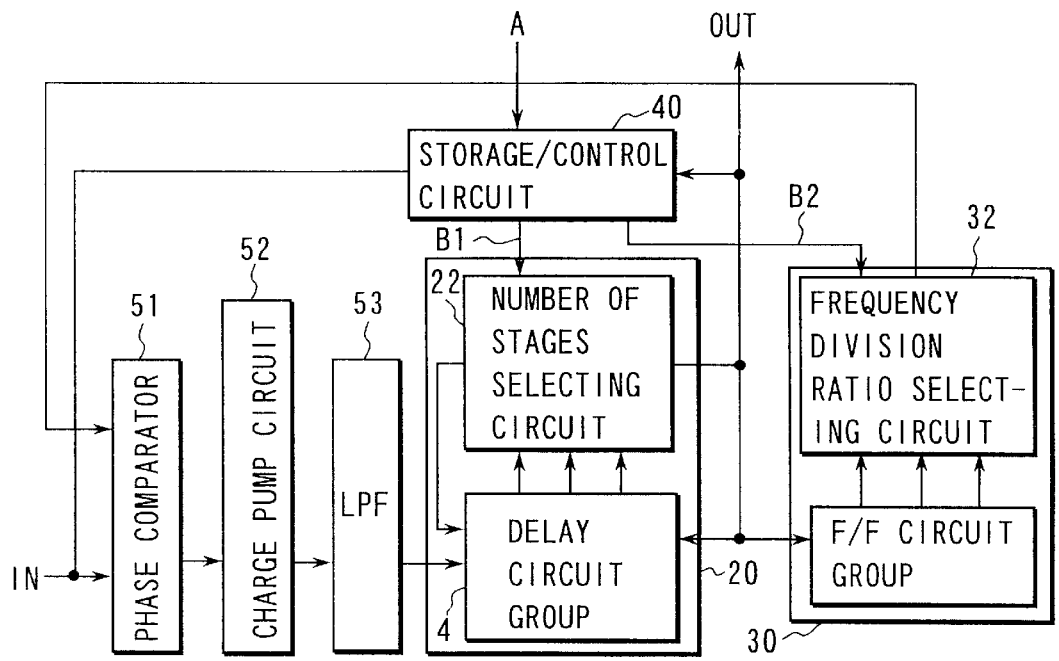
FIG. 1 is a block diagram showing a PLL circuit according to a first embodiment of the present invention.

FIG. 1 shows a PLL circuit according to a first embodiment of the present invention.

In FIG. 1, reference numeral 51 denotes a phase comparator, 52 denotes a charge pump circuit, 53 denotes an LPF (Low Pass Filter), 20 denotes a VCO (ring oscillator), 30 denotes a frequency divider, and 40 denotes a storage/control circuit.

Figure 5:
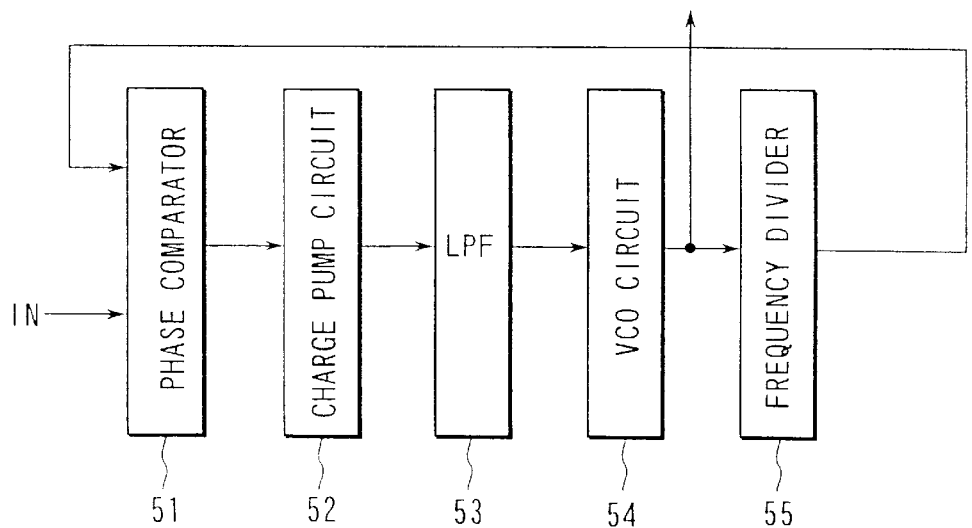
FIG. 5 is a block diagram showing a conventional PLL circuit.
Figure 6:
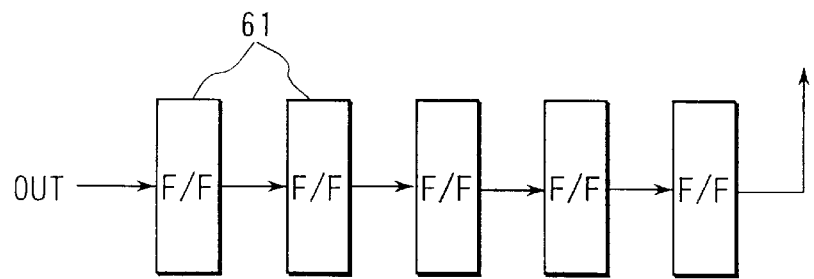
FIG. 6 is a block diagram showing an example of a frequency divider in FIG. 5.
Figure 7:
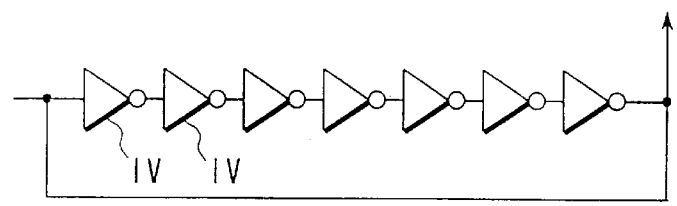
FIG. 7 is a block diagram showing an example of a VCO in FIG. 5.

The same reference numerals as in FIG. 5 are assigned to this PLL circuit, since it is the same as the PLL circuit described above with reference to FIG. 5 except the following two points.

(1) There is included in the same LSI chip a storage/control circuit 40 for storing information on the number of stages of the delay circuits (hereinafter referred to as "number of stages of delay circuits") of the VCO 20 having a proper lock range for the PLL output signal OUT, and controlling the number of stages of delay circuits in the VCO 20 and a dividing ratio of the frequency divider 30 on the basis of stored information with respect to the designated PLL output signal OUT at a desired time. The above proper lock range means a lock range including the designated PLL output signal OUT in its central region (the PLL output frequency resides in a more central portion, not in an end portion of the lock range).

In this embodiment, the storage/control circuit 40 stores information on the number of states of delay circuits having a more proper lock range not only in accordance with the PLL output signal OUT but in accordance with the relationship between the PLL output signal OUT and the frequency of a reference signal IN to be inputted to the phase comparator 51.

(2) At a desired time, the number of stages of delay circuits of the VCO 20 and the number of stages of the phase divider 30 are switched under the control of an output from the storage/control circuit 40.

Figure 2A:
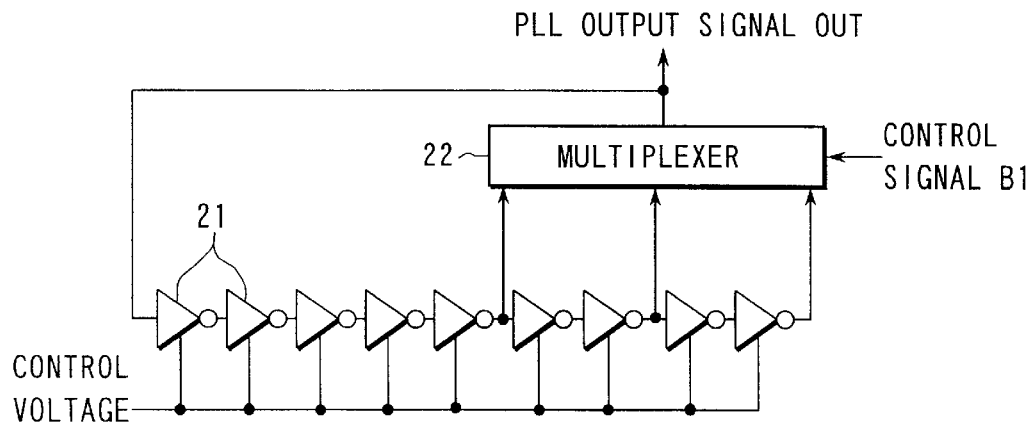
FIGS. 2A and 2B are block diagrams showing an example of a VCO in FIG. 1.

FIG. 2A is a block diagram showing an example of a frequency-variable type ring oscillator used as the VCO 20 in FIG. 1.

This ring oscillator comprises voltage-variable type inverter delay circuits 21 connected in an odd number of multiple stages (9 stages in this example), and a number of stages selecting circuit 22 for selecting the number of stages of the delay circuits (5, 7, 9 stages) to be used in the inverter delay circuits 21 connected in multiple stages. As the number of stages selecting circuit 22, there is used a multiplexer 22 for selecting one of output signals from fifth, seventh or ninth odd-number stages in the inverter delay circuits 21 connected in multiple stages, on the basis of a control signal B1 from a frequency control circuit 42 described below, and supplying the signal to a feedback path to a delay circuit of a first stage in the delay circuits.

An output signal of the VCO 20 is supplied to the frequency divider 30, and also supplied to a desired circuit (not shown) as the PLL output signal OUT, for example, as an internal clock signal of the LSI circuit.

The relationship between the selected number of stages in the inverter delay circuits 21 connected in multiple stages and the lock range of the PLL output signal OUT has such characteristics (PLL output frequency characteristics) as described above with reference to FIG. 8.

Specifically, when the number of stages of the inverter delay circuits 21 is changed, the delay time of the whole delay circuits greatly changes in a step-like fashion. When the delay time of the inverter delay circuits 21 is varied by a control voltage CR input in the state of fixing the number of stages of the inverter delay circuits 21, the delay time of the whole delay circuits varies almost continuously within a certain range.

Figure 8:
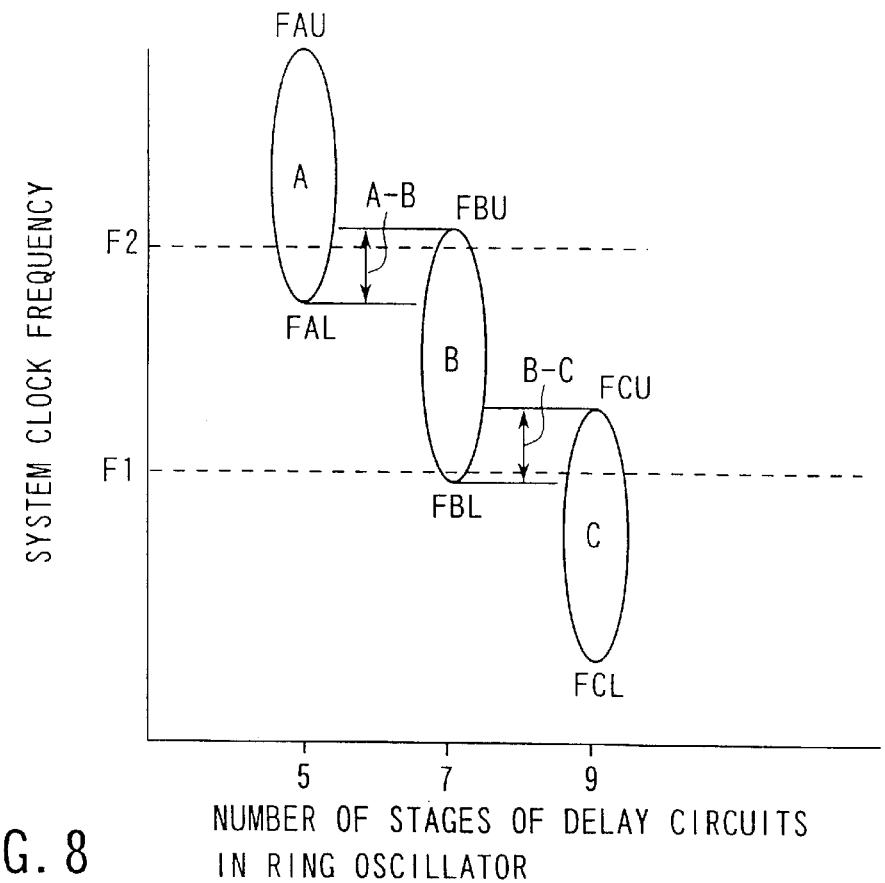
FIG. 8 is a characteristic diagram showing an example of relationship between lock ranges in the cases where the number of stages of the inverter delay circuits in the ring oscillator in FIG. 7 is 5, 7 and 9.

In this case, one ends of lock ranges of the delay circuits whose number of stages of the inverter delay circuits 21 of the VCO 20 are different from each other by 2 stages (for example, circuits having 7 stages and 5 stages of delay circuits 21 respectively, or circuits having 7 stages and 9 stages respectively) overlap as shown in FIG. 8. The overlapping portions are denoted by reference symbols A-B and B-C respectively.

Figure 2B:
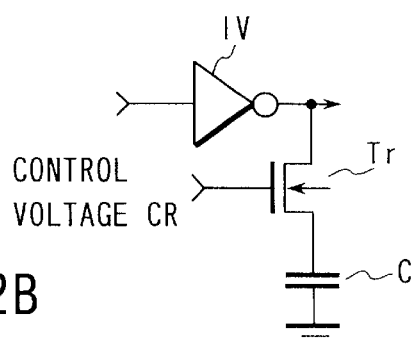

FIG. 2B shows an example of a circuit for varying the delay time of each inverter delay circuit 21 by a control voltage CR input in each of the inverter delay circuits 21 shown in FIG. 2A. The circuit has a structure wherein an integrating circuit comprising a series circuit having a MOS transistor Tr and a capacitor C is connected between an output terminal of an inverter IV and a ground terminal. For example, when the inverter IV is connected between a power source of 0–5V, a predetermined voltage having a value between 0V and 5V is supplied as a control voltage CR to a gate of the MOS transistor Tr. Thereby, a time constant of charge or discharge of the capacitor C connected to an output side of the inverter IV varies according to the value of the control voltage CR, and thereby a delay time of each inverter circuit 21 can be controlled.

Figure 3:
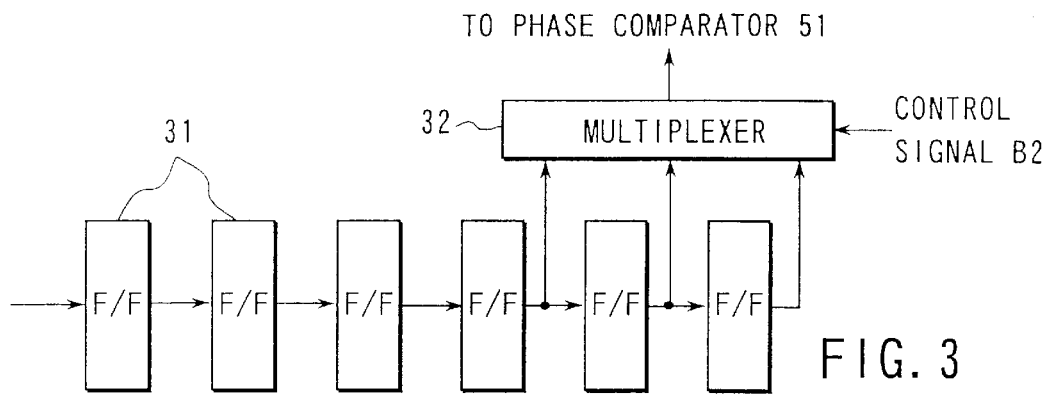
FIG. 3 is a block diagram showing an example of a frequency divider in FIG. 1.

FIG. 3 is a block diagram showing an example of the frequency divider 30 in FIG. 1.

The frequency divider comprises F/F circuits 31 connected in multiple stages and a frequency division ratio selecting circuit 32 for selecting the number of frequency dividing stages to be used in the F/F circuits 31 connected in multiple stages. As the frequency division ratio selecting circuit 32, there is used a multiplexer 32 for selecting a stage for outputting a frequency-division output from the F/F circuits 31 connected in multiple stages, on the basis of a control signal B2 from a frequency control circuit 42 of FIG. 4, and supplying an output from the selected stage to the phase comparator 51. The frequency division ratio corresponds to a ratio of the PLL output frequency relative to the frequency of the reference signal.

Figure 4:
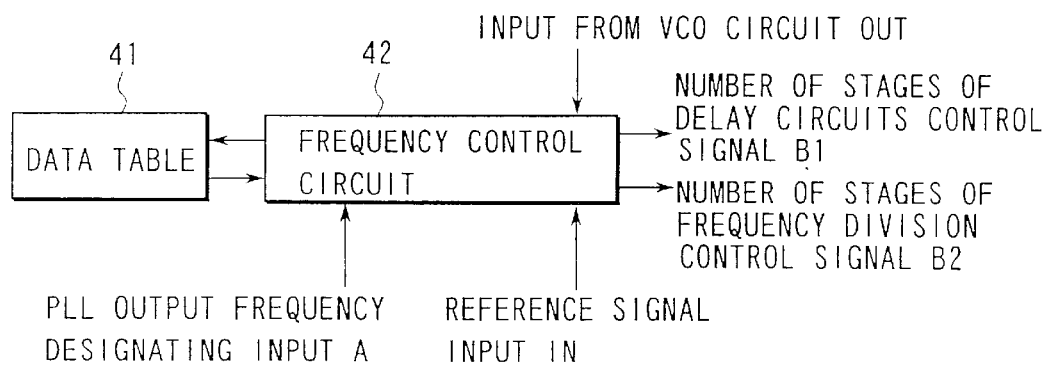
FIG. 4 is a block diagram showing an example of a storage/control circuit in FIG. 1.

FIG. 4 is a block diagram showing an example of the storage/control circuit 40 in FIG. 1.

The storage/control circuit 40 comprises a data table 41 (a mask ROM, for example) for storing information on the number of stages of delay circuits of the ring oscillator 20 having a lock range including the designated PLL output signal OUT in its central region, and a frequency control circuit 42 which controls reading-out from the data table 41, information denoting the relation between a PLL output frequency data A designated from outside, the reference signal frequency IN and the output signal OUT of the VCO, so as to generate control signals B1 and B2 for controlling the number of stages of delay circuits of the VCO 20 and the frequency division ratio of the frequency divider 30 on the basis of the read-out information.

In this embodiment, though the control signals B1 and B2 are generated from the frequency control circuit 42 on the basis of the information from the data table 41, the control signals B1 and B2 may be generated on the basis of the reference frequency signal IN and the output signal OUT of the VCO by hardware.

As the basic operation of the PLL circuit having the structure shown in FIG. 1, a frequency of an output from the VCO 20 shown in FIG. 2 is divided by a number M by the frequency divider 30 shown in FIG. 3, the frequency-division output and the reference signal IN are compared by the phase comparator 51, a control voltage in association with the comparison output is generated by the charge pump circuit 52 and the LPF 53, and supplied to the VCO 20 as the delay time control input CR of the inverter delay circuits 21 of the VCO 20.

Thereby, loop control is performed so that the phase of the frequency-division output from the frequency division circuit 30 is controlled to be the same as the phase of the reference signal IN. In the phase-locked state where loop control is stabilized, the VCO 20 is in the state of oscillating at a frequency obtained by dividing the frequency of the reference signal by a number M. Further, the output signal OUT (PLL output) of the VCO 20 is supplied to various circuits as a system clock signal of FIG. 8, for example.

Furthermore, when the PLL output frequency is designated by the PLL output frequency designating input A at a desired time (such as shipping or a non-used state), the storage/control circuit 40 reads out the information on the number of stages of delay circuits of the ring oscillator having a proper lock range with reference to the frequency of the reference signal IN, and controls the number of stages of delay circuits of the VCO 20 and the frequency division ratio of the frequency divider 30 on the basis of the read-out information.

The function of the storage/control circuit 40 will now be described in detail with reference to FIG. 8.

For example, in FIG. 8, suppose that a PLL output frequency F1 is designated in the designating signal A. In such a case, the frequency F1 is positioned in the vicinity of a lower end of the lock range B in the case where the number of stages of delay circuits of the ring oscillator is 7, but positioned near the center of the lock range C in the case where the number of stages of delay circuits is 9. Therefore, the number of stages of delay circuits 9 is a more proper number of stages, and the VCO 20 is switched from the state of the number of stages of delay circuits 7 to the state of the number of stages of delay circuits 9.

Specifically, the data table 41 stores frequencies of both ends of each lock range A, B and C, that is, FAU/FAL, FBU/FBL, and FCU/FCL. The frequency control circuit 42 first detects that the designated frequency F1 is included in the lock ranges B and C read-out from the data table 41 on the basis of comparisons between F1 and these end frequencies FAU/FAL, FBU/FBL, and FCU/FCL, and then the frequency control circuit 42 calculates the differences between the frequency F1 and frequencies FBL and FCU at the ends of the lock ranges B and C. In this case, since the calculation result shows that the designated frequency F1 is positioned nearer to the center in the lock range C than that in the lock range B, the delay circuit stage number 9 is selected, and the control signal B1 for selecting the number of stages of delay circuits 9 is transmitted to the multiplexer 22 to operate the VCO 20 as a ring oscillator having 9 stages.

Further, for example, when a frequency F2 is designated, in the same manner, since the frequency F2 is positioned nearer to the center of the lock range A in the case where the number of stages of delay circuits of the ring oscillator is 5 in comparison with the lock range B in the case where the delay circuit stage number is 7, the control signal B1 for switching the VCO 20 from the state of the 7-stage delay circuit to the state of the 5-stage delay circuit.

According to the PLL circuit of the above described first embodiment, since the number of stages of delay circuits can be set so that the designated PLL output signal OUT may fall in a region of a selected one of the plural lock ranges, which region is as close as possible to the center of the selected lock range, the stability of the PLL operation can be ensured. Further, even when the PLL output signal OUT is greatly changed, the number of stages of delay circuits of the ring oscillator can be easily switched. Thereby, the PLL circuit can be operated with the number of stages of a proper lock range, and it is possible to always maintain the PLL output frequency in a central region of a lock range in association with a proper stage number.

Therefore, it is possible to stably supply a PLL output signal whose jitter component is minimized, through a broad frequency range without being influenced by environmental change.

Further, when the PLL output frequency is caused to be changed, increase of manufacturing cost due to redesign of mask pattern to change the number of stages of delay circuits and extension of designing period can be prevented, thereby permitting a prompt commercialization of the circuit.

A Modification of the First Embodiment

In the case where non-inversion type delay circuits are used in the VCO 20 instead of the inversion type inverter delay circuits 21, it suffices to insert an inverting circuit in its feedback loop. In this case, the number of stages of delay circuits is not limited to odd numbers as in the first embodiment, but may be an even number.

Figure 9:
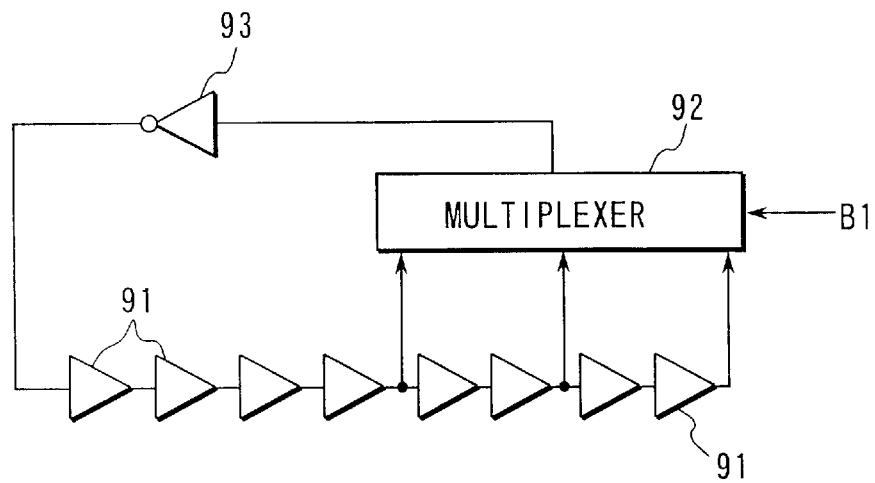
FIG. 9 is a block diagram showing an example of forming a ring oscillator by non-inversion type delay circuits without using inverters.

FIG. 9 shows an example of using non-inversion type delay circuits, wherein non-inversion type delay circuits 91 having 8 stages are used, and the ring oscillator is structured so that any one of the outputs of the 4th, 6th and 8th stages of the delay circuits is selected by a multiplexer 92 on the basis of the control signal B1, and the selected output is fed back to the input side via an inverter 93 of one stage. In this case, when the output from the non-inversion type delay circuit 91 of 8th stage is selected by the multiplexer 92, a ring oscillator comprising 9 stages of delay circuits including the inverter 93 is formed.

Second Embodiment

Though in the first embodiment the number of stages to b e used in th e delay circuits 21 connected in multiple stages is selected by the multiplexer 22, the present invention is not limited to the first embodiment, and it is possible to change the ring oscillator so as to be provided with a plurality of sets of delay circuits in which the numbers of connected stages of the inverter delay circuits 21 are different from each other and to select one set of the delay circuits having a desired number of stages by a multiplexer 104 on the basis of the control signal B1.

Figure 10:
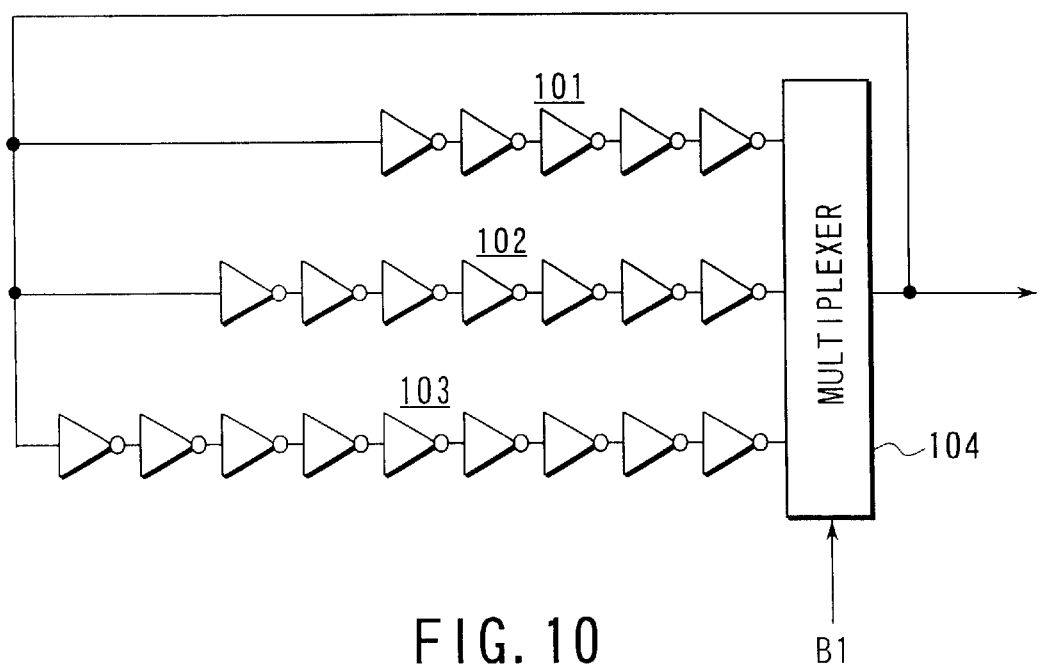
FIG. 10 is a block diagram showing an example of forming a ring oscillator by a plurality of sets of delay circuits.

FIG. 10 shows an example of such a ring oscillator. The ring oscillator is structured so that one of output terminals of delay circuits 101, 102 and 103 comprising inverters of 5, 7 and 9 stages respectively is selected by the multiplexer 104, and an output from the selected output terminal is fed back to the input side via a corresponding delay circuit, for example, delay circuit 101 of 5 stages. In this case, as described above with reference to FIG. 2B, if the lock range of the delay circuit 102 comprising 7 stages of inverters is widened by setting a long delay time for each inverter of the delay circuit 102, the resultant overlapping ranges A-B and B-C in FIG. 8 can be widened. Therefore, the overlapping ranges between the lock ranges of the delay circuits can enlarged without enlarging the lock ranges of the delay circuits 101 and 103 having 5 and 9 stages, and thereby a delay circuit having an optimum lock range can be selected in accordance with the PLL output frequency, thereby enabling to provide a small-sized LSI including a stable PLL circuit.

As described above, according to the PLL circuit of the present invention, stability of the PLL operation can be ensured by setting a designated PLL frequency in the central region of a lock range, the number of stages of the delay circuits of the ring oscillator can be easily switched even when the PLL output frequency is greatly changed, thereby a desired lock range can be obtained, and it is possible to maintain the PLL output frequency in the central region of a lock range.

Therefore, it is possible to stably supply a PLL output signal whose jitter component is minimized, through a broad frequency range without being influenced by environmental change, whereby the redesign to change the number of stages of delay circuits can be prevented, increase of manufacturing cost can be inhibited, and prompt commercialization of the circuit is possible.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A PLL circuit comprising:

a ring oscillator used as a voltage controlled oscillator;

a frequency divider for dividing a frequency of an output signal of the ring oscillator;

a phase comparator for comprising a frequency-division output from the frequency divider and a reference signal;

a control voltage generating circuit for generating a control signal for controlling the number of stages of delay circuits of the ring oscillator on the basis of a designated PLL output frequency; and a data table for storing information on the number of stages of the delay circuits of the ring oscillator having a lock range including the designated PLL output frequency in a central region thereof;

wherein the control circuit controls reading-out the information from the data table with reference to the designated PLL output frequency, and generates a control signal for controlling the number of the stages of the delay circuits of the ring oscillator and a frequency division ratio of the frequency divider on the basis of read-out information.

2. A PLL circuit according to claim 1, wherein the ring oscillator comprises:
   a plurality of delay circuits connected in multiple stages;
   a multiplexer for selecting one of output signals of odd-number stages in the delay circuits connected in multiple stages, and supplying the selected output signal to a first stage of a delay circuit via a feedback loop.

3. A PLL circuit according to claim 1, wherein the ring oscillator is formed by selectively connecting one of a plurality of said delay circuits having stage numbers different from each other; and
   the plurality of delay circuits provide look ranges over overlapping each other.

4. PLL circuit according to claim 1, wherein the delay circuits comprise an inverter, and an integrating circuit including a series circuit of a MOS transistor and a capacitor connected between an output terminal of the inverter and a ground.

5. A PLL circuit according to claim 1, wherein the frequency divider comprises:
   a plurality of flip-flop circuits connected in multiple stages; and
   a multiplexer for selecting a stage for outputting a frequency-division output in the flip-flop circuits connected in multiple stages, and supplying an output from the selected stage to the phase comparator.

6. A PLL circuit comprising:
   a ring oscillator used as a voltage controlled oscillator;
   a frequency divider for dividing a frequency of an output signal of the ring oscillator;
   a phase comparator for comprising a frequency-division output from the frequency divider and a reference signal;
   a control voltage generating circuit for generating a control signal for controlling the number of stages of delay circuits of the ring oscillator on the basis of a designated PLL output frequency; and
   a data table for storing information on the number of the stages of the delay circuits of the ring oscillator having a proper lock range in accordance with a relationship between the designated PLL output frequency and a frequency of the reference signal to be inputted to the phase comparator;
   wherein the control circuit controls reading-out the information from the data table with reference to the designated PLL output frequency and the frequency of the reference signal, and generates a control signal for controlling the number of the stages of the delay circuits of the ring oscillator and the frequency division ration of the frequency divider on the basis of the read-out information.

7. A PLL circuit according to claim 6, where the ring oscillator comprises:
   a plurality of inverter delay circuits connected in multiple stages; and
   a multiplexer for selecting one of output signals of odd-number stages in the inverter delay circuits connected in multiple stages, and supply the selected output signal to a first stage of a delay circuit via a feedback loop.

8. A PLL circuit according to claim 6, wherein the frequency divider comprises:
   a plurality of flip-flop circuits connected in multiple stages; and
   a multiplexer for selecting a stage for outputting a frequency-division output in the flip-flop circuit connected in multiple stages, and supplying an output from the selected stage to the phase comparator.

9. A PLL circuit according to claim 6, wherein the delay circuit comprises an inverter; and
   an integrating circuit including a series circuit of a MOS transistor and a capacitor connector between an output terminal of the inverter and a ground.

10. A PLL circuit according to claim 6, wherein the ring oscillator is formed by selectively connecting one of a plurality of said delay circuits having stage numbers different from each other;
    and the plurality of delay circuits provide look ranges over overlapping each other.

11. A PLL circuit comprising:
    a ring oscillator used as a voltage controlled oscillator;
    a frequency divider for dividing a frequency of an output signal of the ring oscillator;
    a phase comparator for comparing a frequency-division output from the frequency divider and a reference signal;
    a control voltage generating circuit for generating a control voltage to be inputted to the ring oscillator in accordance with a comparison output from the phase comparator; and
    a control circuit for generating a control signal for controlling the number of stages of delay circuits of the ring oscillator on the basis of a designated PLL output frequency, wherein the frequency divider comprises:
      a plurality of flip-flop circuits connected in multiple stages; and
      a multiplexer for selecting a stage for outputting a frequency-division output in the flip-flop circuits connected in multiple stages, and supplying an output from the selected stage to the phase comparator.

12. A PLL circuit comprising:
    a ring oscillator used as a voltage controlled oscillator;
    a frequency divider for dividing a frequency of an output signal of the ring oscillator;
    a phase comparator for comparing a frequency-division output from the frequency divider and a reference signal;
    a control voltage generating circuit for generating a control voltage to be inputted to the ring oscillator in accordance with a comparison output from the phase comparator; and
    a control circuit for generating a control signal for controlling the number of stages of delay circuits of the ring oscillator on the basis of a designated PLL output frequency,
    wherein the ring oscillator is formed by selectively connecting one of a plurality of said delay circuits having stage numbers different from each other, and the plurality of delay circuits provide lock ranges overlapping each other.

13. A PLL circuit according to claim 12, wherein the ring oscillator comprises a plurality of delay circuits having stage numbers different from each other and a multiplexer for selecting one of the delay circuits, and said plurality of delay circuits provide lock ranges overlapping each other.

14. A PLL circuit according to claim 12, wherein the ring oscillator includes an odd number of stages of inversion-type delay circuits.

15. A PLL circuit according to claim 12, wherein the ring oscillator comprises an even number of stages each including a number of non-inversion type delay circuits, and a feedback circuit including at least one stage of inversions type delay circuits.

* * * * *